United States Patent
Chen et al.

(10) Patent No.: US 9,185,808 B2
(45) Date of Patent: Nov. 10, 2015

(54) PRINTED CIRCUIT BOARD COMPENSATION PROCESSING METHOD, DEVICE, AND PCB

(71) Applicants: PEKING UNIVERSITY FOUNDER GROUP CO., LTD., Beijing (CN); ZHUHAI FOUNDER TECH. HI-DENSITY ELECTRONIC CO., LTD., Zhuhai, Guangdong (CN); ZHUHAI FOUNDER PCB DEVELOPMENT CO., LTD., Zhuhai, Guangdong (CN)

(72) Inventors: Lanyuan Chen, Beijing (CN); Haode Li, Beijing (CN)

(73) Assignees: Peking University Founder Group Co., Ltd., Beijing (CN); Zhuhai Founder Tech. Hi-Density Electronic Co., Ltd., Zhuhai, Guangdong (CN); Zhuhai Founder PCB Development Co., Ltd., Zhuhai, Guangdong (CN)

( * ) Notice: Subject to any disclaimer, the term of this patent is extended or adjusted under 35 U.S.C. 154(b) by 318 days.

(21) Appl. No.: 13/715,947

(22) Filed: Dec. 14, 2012

(65) Prior Publication Data

US 2013/0180761 A1 Jul. 18, 2013

(30) Foreign Application Priority Data

Dec. 16, 2011 (CN) .......................... 2011 1 0424662

(51) Int. Cl.
G06F 17/50 (2006.01)
H05K 3/00 (2006.01)
H05K 1/02 (2006.01)
H05K 1/11 (2006.01)

(52) U.S. Cl.
CPC ............ *H05K 3/0005* (2013.01); *H05K 1/0296* (2013.01); *H05K 1/111* (2013.01); *H05K 2201/09381* (2013.01); *H05K 2201/10734* (2013.01)

(58) Field of Classification Search
CPC ... H05K 3/0005; H05K 1/111; H05K 1/0296; H05K 2201/10734; H05K 2201/09381
USPC ......................................................... 716/137
See application file for complete search history.

(56) References Cited

U.S. PATENT DOCUMENTS 6,453,455 B1 * 9/2002 Kumada et al. ................ 716/130
2001/0039642 A1 * 11/2001 Anzai ............................. 716/10

* cited by examiner

*Primary Examiner* — Jack Chiang
*Assistant Examiner* — Brandon Bowers
(74) *Attorney, Agent, or Firm* — Finnegan, Henderson, Farabow, Garrett & Dunner, LLP

(57) ABSTRACT

The invention discloses a printed circuit board compensation processing method for fabricating a BGA despite a small distance between a line and a pad of the BGA. The method includes compensating a pad and/or a line under a predetermined condition, and removing a portion of the pad facing the line by a second predetermined width when the shortest distance between the compensated line and pad is smaller than a first predetermined distance. The invention further discloses a device for performing the method and a PCB fabricated using the method.

10 Claims, 4 Drawing Sheets

PRINTED CIRCUIT BOARD COMPENSATION PROCESSING METHOD, DEVICE, AND PCB

RELATED APPLICATIONS

This application claims the benefit of Chinese Patent Application No. 201110424662.8, filed Dec. 16, 2011.

FIELD

The present invention relates to the field of fabricating a printed circuit board ("PCB") and particularly to a PCB compensation processing method, device and PCB.

BACKGROUND

In order to accommodate the development of integrated circuits, a larger number of elements have to be held in a limited area of a PCB, thus imposing more stringent requirements on the spacing, the size, etc., of the elements on the PCB.

A Ball Grid Array (BGA), which may be included in a PCB and is structured as an array of ball grids, is a method of packaging an integrated circuit using an organic carrier board and has the characteristics of (1) a reduced packaging area, (2) more functions and a larger number of pins, (3) the PCB capable of being self-aligned and easily tin-plated during welding; (4) high reliability; (5) good electrical performance and overall low cost, etc.

In order to use space more effectively and improve the performance of a product, a line can be designed to travel between pads (BGA pads). One or more lines can be designed to travel between two pads in order to provide better performance. Integrated elements become increasingly smaller and have an increasing number of functions. As a result, for each integrated element: the number of pads increase; the pad area becomes smaller for each pad; and the spacing between pads becomes narrower. In order to satisfy design requirements, a line often has to be arranged between two pads, thus making the spacing between the line and the pad smaller, and the line width smaller.

The inventors have identified during making of a technical solution in embodiments of the invention at least the following technical problems in the prior art:

When the required distance between the line and the pad is too small to satisfy a required spacing necessary for fabrication, it may be impossible or difficult to fabricate a PCB, or a PCB may be fabricated at a low yield rate.

SUMMARY

Embodiments of the invention provide a PCB compensation processing method, device, and PCB so that a BGA can be fabricated despite a small distance between a line and a pad.

A PCB compensation processing method includes: compensating a pad and/or a line under a predetermined condition; and removing a portion of the pad facing the line by a second predetermined width when the shortest distance between the compensated line and pad is smaller than a first predetermined distance.

A PCB compensation processing device includes: a compensating device configured to compensate a pad and/or a line under a predetermined condition; and an edge removing device configured to remove a portion of the pad facing the line by a second predetermined width when the shortest distance between the compensated line and pad is smaller than a first predetermined distance.

A PCB is provided. After a compensation process is performed on the PCB, when a distance between a compensated line and a pad adjacent to the line is smaller than a first predetermined distance, a portion of the pad facing the line may be removed by a second predetermined width.

According to embodiments of the invention, a pad and/or a line may be compensated under a predetermined condition. A portion of the pad facing the line is removed by a second predetermined width when the shortest distance between the compensated line and pad is smaller than a first predetermined distance. A portion of the pad may be removed by a specific width so that the shortest distance between the line and the pad satisfies a predetermined requirement (that is, the shortest distance is greater than or equal to the first predetermined distance), so that a BGA can be fabricated despite of a small distance between the line and the pad, thus preventing short circuit and other failures from occurring due to the small distance between the line and the pad.

DETAILED DESCRIPTION OF THE EMBODIMENTS

According to embodiments of the invention, a pad and/or a line may be compensated under a predetermined condition. A portion of the pad facing the line is removed by a second predetermined width when the shortest distance between the compensated line and pad is smaller than a first predetermined distance. A portion of a pad may be removed by a specific width so that the shortest distance between the line and the pad satisfies a predetermined requirement (that is, the shortest distance is greater than or equal to the first predetermined distance). As a result, a BGA can be fabricated despite of a small distance between the line and the pad, thus preventing short circuit and other failures from occurring due to the small distance between the line and the pad.

Figure 1:
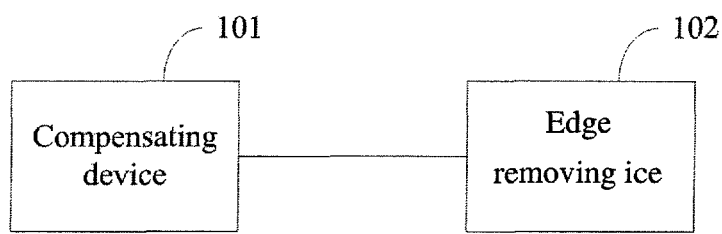
FIG. 1 is a diagram of A PCB compensation processing device according to an embodiment of the invention.
Figure 2A:
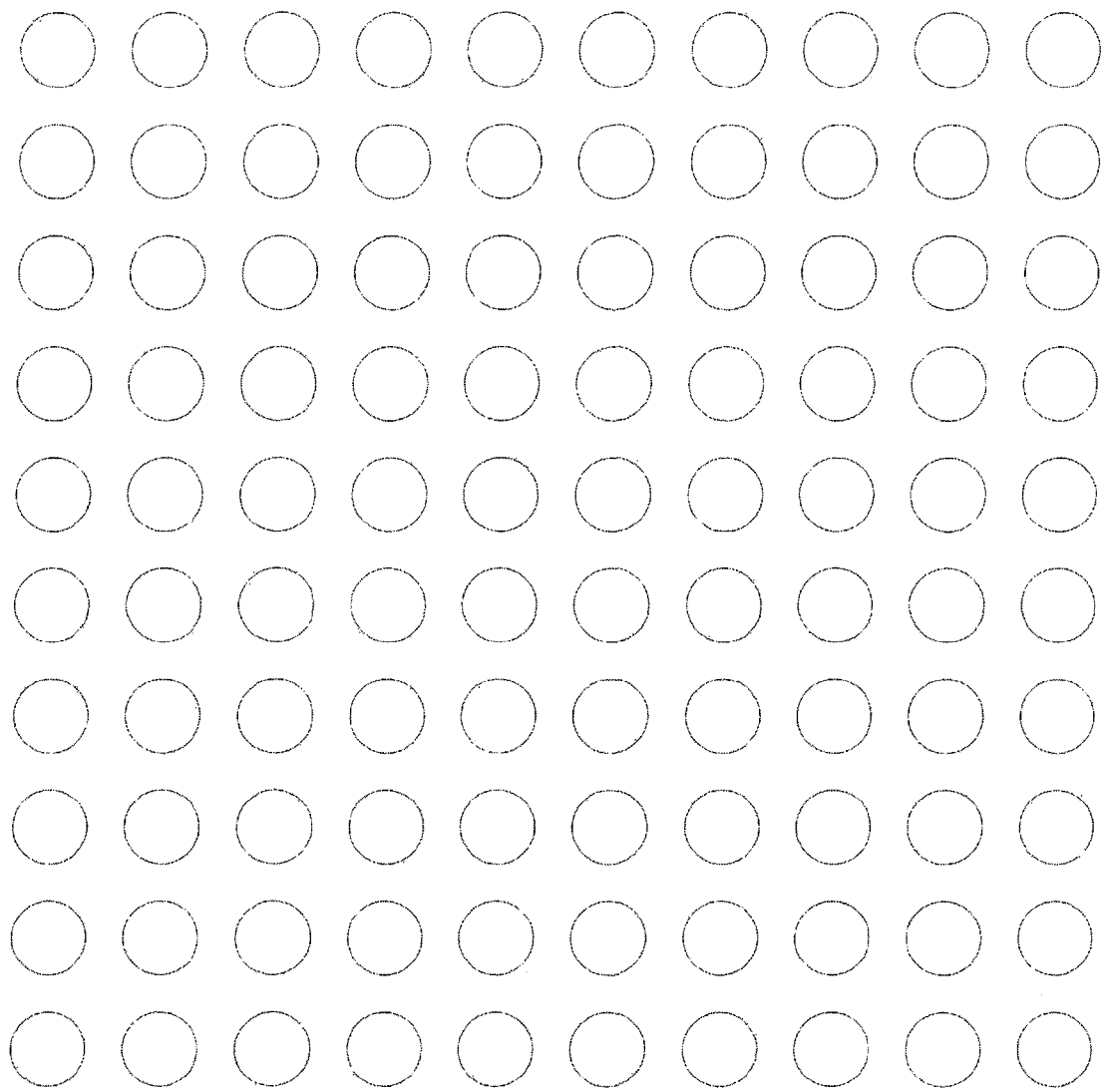
FIG. 2A is a schematic diagram of a BGA according to an embodiment of the invention.

As illustrated in FIG. 1, a PCB compensation processing device according to an embodiment of the invention includes a compensating device 101 and an edge removing device 102. The embodiment of the invention primarily relates to a compensation mode in which it is required that the line width of a line be within a first predetermined distance and the shortest distance between the line and a pad be within the first predetermined distance. That is, the embodiments of the invention primarily relate to a PCB in which it is required that the line width of a line be within a first predetermined distance and that the shortest distance between the line and a pad be within the first predetermined distance. For example, the first predetermined distance may be 3 mil. According to one of preferred embodiments, there may be only one line arranged to travel between two pads. FIG. 2A shows a schematic diagram of a BGA according to an embodiment of the invention, where each circle represents a pad.

Figure 2B:
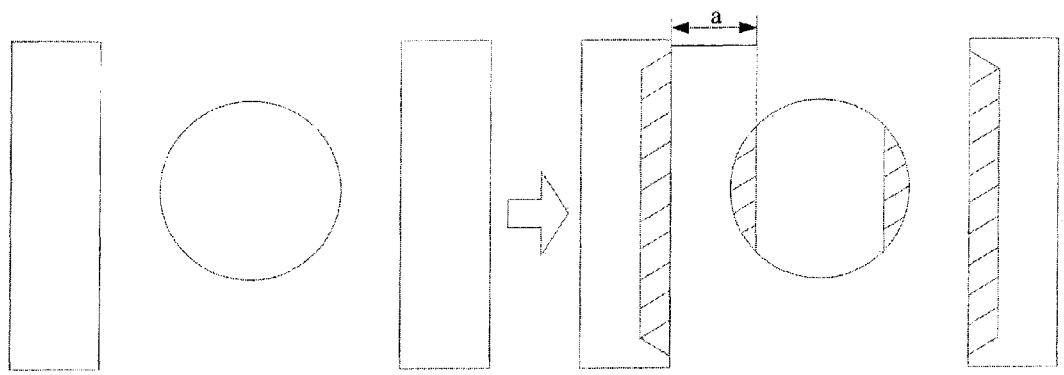
FIG. 2B is a schematic diagram of a line and a pad after compensation and edge removal according to an embodiment of the invention.

The compensating device 101 is configured to compensate a pad and/or a line under a predetermined condition which may be that the diameter of the pad is increased by a first predetermined length and the width of the line is increased by a third predetermined width. The predetermined condition in one embodiment of the invention may be a compensating method. A compensation may be performed according to the compensating method. In FIG. 2B, a schematic diagram of a compensated line and pad is shown on the left side, and a schematic diagram of the line and the pad processed by the edge removing device 102 is illustrated on the right side.

For example, Table 1 depicts exemplary design data and compensation data:

| Design data | | Compensation data | |
|---|---|---|---|
| Diameter of soldering pad | 250 μm (9.84 mil) | Diameter of soldering pad | +53 μm (2.07 mil) |
| Distance between centers of soldering pads | 500 μm (19.68 mil) | Shortest distance between line and soldering pad | +61 μm (2.4 mil) |
| Shortest distance between soldering pads | 250 μm (9.84 mil) | Distance between outer edge and anti-solder edge of pad | Min 25.4 μm (1 mil) |
| Line width of line | 76 μm (3 mil) | Line width of line | Min 86 μm (3.4 mil) |
| | | Solder mask bridge present or absent | Present |

Figure 2C:
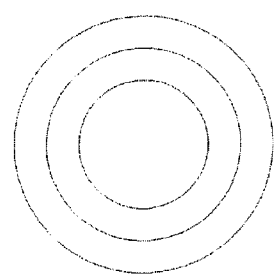
FIG. 2C is a schematic diagram of a pad according to an embodiment of the invention.

In Table 1, the diameter of soldering pad refers to the diameter of a pad; the distance between centers of soldering pads refers to the distance between the centers of two pads; the shortest distance between soldering pads refers to the shortest distance between edges of two pads; and the shortest distance between line and soldering pad refers to the shortest distance between the line and an edge of the pad. Regarding the compensation data, the diameter of the pad may be increased by 53 μm, the shortest distance between the line and the pad may be increased by 61 μm. The distance between the outer edge and the anti-solder edge of the pad is illustrated in FIG. 2C. Further in FIG. 2C, the region between the innermost small circle and the immediately adjacent circle constitutes a copper sheet region which will be coated with solder. The edge of the copper sheet region is referred to as the outer edge of the pad, and the edge of the outermost third circle is referred to as the anti-solder edge of the pad. After compensation, the distance between the outer edge and the anti-solder edge of the pad is at least 25.4 μm. In Table 1, "mil" is a British unit referring to one thousandth of an inch.

The edge removing device 102 is configured to remove a portion of a pad facing a line by a second predetermined width when the shortest distance between the compensated line and pad is smaller than the first predetermined distance. Further, when the shortest distance between the compensated line and pad is smaller than the first predetermined distance, the edge removing device 102 can remove an edge portion of the line adjacent to the pad by a first predetermined width. According to one of the preferred embodiments, only the portion of the edge of the line facing the pad is removed. A line pattern is typically fabricated through etching, so the edge removing device 102 here may actually control and adjust an etching location and perform etching at the location where an edge is required to be removed.

Figure 2D:
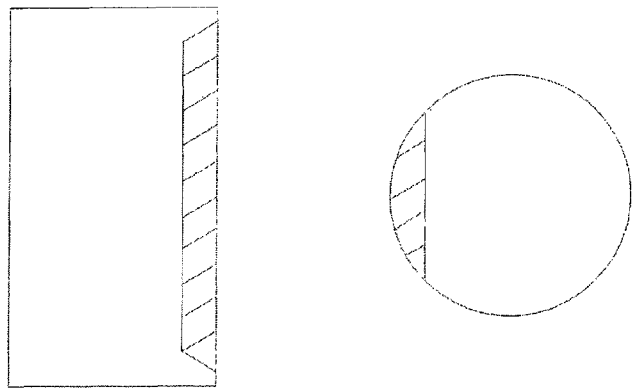
FIG. 2D is a schematic diagram of a portion of a BGA after removing edge portions of a line and a pad according to an embodiment of the invention.

After a compensation process is performed by compensating device 101, the edge removing device 102 may determine whether the shortest distance between the compensated line and pad is smaller than a first predetermined distance. Edge removing device 102 may determine that the BGA is to be processed upon determining that the shortest distance is smaller than the first predetermined distance. For example, in a processing scheme, an edge portion of the pad may be removed, possibly by removing the portion of the pad facing the line by the second predetermined width. Also, the edge of the line adjacent to the pad may be removed, possibly by removing the portion of the line facing the pad, by the first predetermined width. Alternatively in another processing scheme, firstly a portion of the pad may be removed, possibly by removing the portion of the pad facing the line by the second predetermined width. If it is determined that the shortest distance between the line and the removed pad is still smaller than the first predetermined distance, then an edge of the line adjacent to the pad may be removed, possibly by removing the portion of the line facing the pad by the first predetermined width. As illustrated in FIG. 2D, after the removal, the shortest distance between the thinnest portion of the line and the pad is made equal to or greater than the first predetermined distance, where it is optimal to make the shortest distance equal to the first predetermined distance. According to one of the preferred embodiments, the first predetermined width may be equal to the second predetermined width.

For example, with respect to the embodiments in Table 1, edge removing device 102 can remove an edge portion of the line in the width direction, adjacent to the pad, by at most 12.7 μm (0.5 mil), possibly by removing the portion of the line facing the pad. FIG. 2D is a schematic diagram of a portion of the BGA after portions of the line and the pad are removed, where the biased areas represent the removed portions. Particularly, after the removal process, the line width of the thinnest portion of the line is at least 86 μm.

An embodiment of the invention further provides a PCB in which a distance between a compensated line and an adjacent soldering pad is smaller than a first predetermined distance. A portion of the pad facing the line is removed by a second predetermined width. As illustrated in FIG. 2B, a straight distance between the compensated line and the adjacent pad is length a, shown in FIG. 2B. That is, length a is the straight distance between the compensated line and the adjacent pad, a portion of which is removed.

In a PCB according to one of the embodiments, an edge portion of the line adjacent to the pad and facing the pad can be removed by a first predetermined width. For example, the first predetermined distance may be 3 mil. The PCB may include a BGA. A PCB compensation processing method according to one embodiment will be illustrated below.

Figure 3:
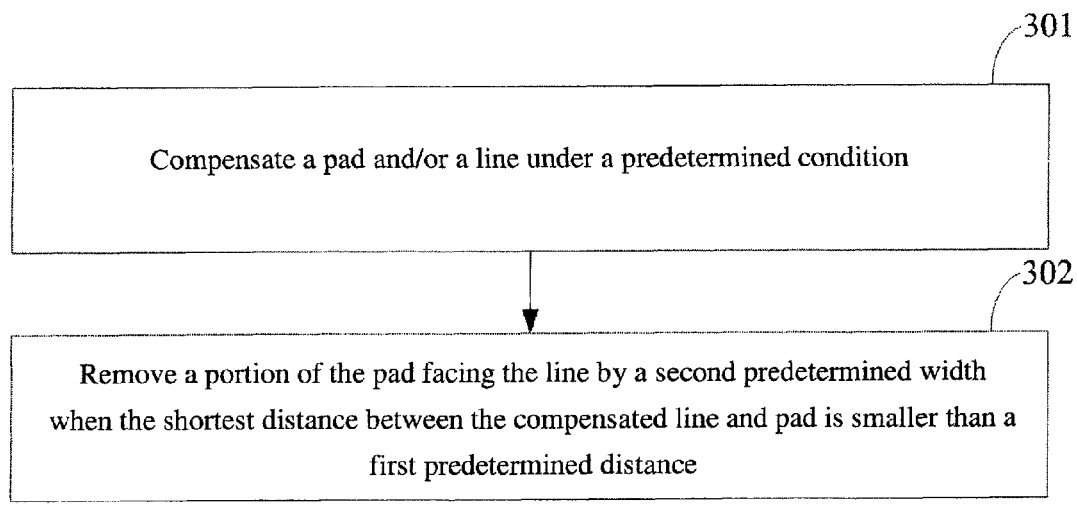
FIG. 3 is a flow chart of A PCB compensation processing method according to an embodiment of the invention.

Referring to FIG. 3, an example of the PCB compensation processing method is described as follows. A method according to an embodiment of the invention is applicable to a PCB in which the shortest distance between a line and a pad is not greater than a first predetermined distance and a line width of the line is not greater than the first predetermined distance.

Step 301: A pad and/or a line may be compensated under a predetermined condition which may be that the diameter of the pad of a BGA is increased by a first predetermined length and the width of the line is increased by a third predetermined width.

Step 302: A portion of the pad facing the line is removed by a second predetermined width when the shortest distance between the compensated line and pad is smaller than a first predetermined distance. Further, if the shortest distance between the compensated line and pad is smaller than the first predetermined distance, then an edge portion of the line adjacent to the pad may be further removed in the width direction by a first predetermined width. According to one of the preferred embodiments, the first predetermined width may be equal to the second predetermined width.

According to the embodiments of the invention, a pad and/or a line may be compensated under a predetermined condition. A portion of the pad facing the line may be removed by a second predetermined width when the shortest distance between the compensated line and pad is smaller than a first predetermined distance. The pad may be removed by a specific width so that the shortest distance between the compensated line and pad satisfies a predetermined requirement (that is, the shortest distance is greater than or equal to the first predetermined distance), so that a BGA can be fabricated despite a distance between the line and the pad that is too small. Therefore, a short circuit and other failures due to the small distance between the line and the pad may be prevented. Of course, it can be appreciated that the invention can be applicable not only to a process of fabricating a BGA but also to a PCB with a small distance between pads and a small distance between a pad and a line.

It would be obvious to those skilled in the art to make various modifications and variations to the invention without departing from the spirit and scope of the invention. Thus the invention is also intended to encompass these modifications and variations thereto provided that these modifications and variations come into the scope of the claims of the invention and their equivalents.

The invention claimed is:

1. A printed circuit board compensation processing method, comprising:
   compensating a pad, or a line, or both of the pad and the line under a predetermined condition; and
   etching a portion of the pad facing the line by a second predetermined width when the shortest distance between the line and the compensated pad, or between the pad and the compensated line, or between the compensated line and the compensated pad, is smaller than a first predetermined distance.

2. The method of claim 1, further comprising:
   etching in a line-width direction an edge portion of the line adjacent to the pad by a first predetermined width when the shortest distance between the line and the compensated pad, or between the pad and the compensated line, or between the compensated line and the compensated pad, is smaller than the first predetermined distance.

3. The method of claim 2, wherein the etching in a line-width direction the edge portion of the line adjacent to the pad by the first predetermined width comprises: etching in the line-width direction an edge portion of the line adjacent to and facing the pad by the first predetermined width so that the shortest distance between the line and the pad is greater than or equal to the first predetermined distance.

4. The method of claim 1, wherein the first predetermined distance is 3 mil.

5. The method of claim 1, wherein the printed circuit board is a printed circuit board having a ball grid array (BGA) structure.

6. A printed circuit board compensation processing device, comprising:
   a compensating device configured to compensate a pad, or a line, or both of the pad and the line under a predetermined condition; and
   an edge removing device configured to etch a portion of the pad facing the line by a second predetermined width when the shortest distance between the line and the compensated pad, or between the pad and the compensated line, or between the compensated line and the compensated pad, is smaller than a first predetermined distance.

7. The device of claim 6, wherein when the shortest distance between the line and the compensated pad, or between the pad and the compensated line, or between the compensated line and the compensated pad, is smaller than the first predetermined distance, the edge removing device is further configured to etch in a line-width direction an edge portion of the line adjacent to the pad by a first predetermined width.

8. The device of claim 7, wherein the edge removing device is further configured to etch in the line-width direction an edge portion of the line adjacent to and facing the pad by the first predetermined width so that the shortest distance between the line and the pad is greater than or equal to the first predetermined distance.

9. The device of claim 6, wherein the first predetermined distance is 3 mil.

10. The device of claim 6, wherein the printed circuit board is a printed circuit board having a ball grid array (BGA) structure.

* * * * *